(12) United States Patent
Caillat et al.

(10) Patent No.: US 7,994,560 B2
(45) Date of Patent: Aug. 9, 2011

(54) INTEGRATED CIRCUIT COMPRISING A TRANSISTOR AND A CAPACITOR, AND FABRICATION METHOD

(75) Inventors: Christian Caillat, Grenoble (FR); Richard Ferrant, Esquibien (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 123 days.

(21) Appl. No.: 12/173,702

(22) Filed: Jul. 15, 2008

(65) Prior Publication Data

US 2009/0121269 A1   May 14, 2009

(30) Foreign Application Priority Data

Jul. 16, 2007   (FR) ..................... 07 56524

(51) Int. Cl.
*H01L 29/94* (2006.01)
(52) U.S. Cl. ............... 257/303; 257/301; 257/E27.016
(58) Field of Classification Search ......... 438/243–249, 438/268–272; 257/298–305, E27.016
See application file for complete search history.

(56) References Cited

U.S. PATENT DOCUMENTS

| | | | |
|---|---|---|---|
| 4,214,312 A * | 7/1980 | Amir | 365/182 |
| 6,437,388 B1 | 8/2002 | Radens et al. | |
| 2006/0043617 A1 | 3/2006 | Abbott | |

FOREIGN PATENT DOCUMENTS

GB   2 288 276 A1   10/1995

OTHER PUBLICATIONS

Patent Abstracts of Japan, 61 140172, Toshiba Corp., Jun. 27, 1986.
Patent Abstracts of Japan, 2007 157977, Renesas Technoogy Corp., Jun. 21, 2007.
Patent Abstracts of Japan, 05 102421, Ind Technol Res Inst, Apr. 23, 1993.
Patent Abstracts of Japan, 63 284847, Oki Electric Ind Co Ltd, Nov. 22, 1988.
Preliminary French Search Report, FR 07 56524, dated Feb. 22, 2008.

* cited by examiner

*Primary Examiner* — Richard A. Booth
(74) *Attorney, Agent, or Firm* — Gardere Wynne Sewell LLP

(57) ABSTRACT

An integrated circuit includes a substrate and at least one active region. A transistor produced in the active region separated from the substrate. This transistor includes a source or drain first region and a drain or source second region which are connected by a channel. A gate structure is position on top of said channel and operates to control the channel. The gate structure is formed in a trench whose sidewalls have a shape which converges (narrows) in the width dimension towards the substrate. A capacitor is also formed having a first electrode, a second electrode and a dielectric layer between the electrodes. This capacitor is also formed in a trench. An electrode line is connected to the first electrode of the capacitor. The second electrode of the capacitor is formed in a layer shared in common with at least part of the drain or source second region of the transistor. A bit line is located beneath the gate structure. The integrated circuit may, for example, be a DRAM memory cell.

23 Claims, 19 Drawing Sheets

INTEGRATED CIRCUIT COMPRISING A TRANSISTOR AND A CAPACITOR, AND FABRICATION METHOD

PRIORITY CLAIM

The present application is a translation of and claims priority from French Application for Patent No. 07 56524 of the same title filed Jul. 16, 2007, the disclosure of which is hereby incorporated by reference.

BACKGROUND OF THE INVENTION

1. Technical Field of the Invention

The present invention relates in general to integrated circuits, especially memory cells. More particularly, the present invention relates to memory cells of the dynamic random access memory (DRAM) type and more particularly to on-board memories of the embedded dynamic random access memory (eDRAM) type that are compatible with a process for fabricating a device incorporating such a memory and CMOS components.

2. Description of Related Art

Conventionally, a DRAM memory takes the form of a matrix of rows and columns at the intersections of which there are memory cells consisting of a memory element, typically a capacitor, and a switch for controlling this memory element, in general an MOS transistor.

A DRAM memory cell typically comprises an MOS control transistor and a storage capacitor that are connected in series between a reference and a bit line. The gate of the control transistor is connected to a word line. The transistor controls the flow of electric charge between the capacitor and the bit line. The electric charge on the capacitor determines the logic level, 1 or 0, of the memory cell. Upon read-out of the memory cell, the capacitor is discharged into the bit line.

A large number of DRAM cells thus constructed are assembled in the form of a matrix so as to generate a memory plane that may comprise millions of elementary cells. The memory plane is, for some applications, located within a complex integrated circuit. The memory is then said to be on-board (or embedded) memory.

There is a need for an integrated circuit having a higher memory cell density.

There is a need to reduce the size of the components of a DRAM memory.

There is also a need to reduce the effects of size reduction on the performance of such a memory.

SUMMARY OF THE INVENTION

According to one embodiment, an integrated circuit comprises: a substrate; at least one active region; at least one transistor produced in the active region comprising, away from the substrate, a source or drain first region and a drain or source second region, respectively, which are connected by a channel and a gate-acting structure on top of said channel and capable of controlling said channel, said gate-acting structure having a shape converging towards the substrate; at least one capacitor, comprising a first electrode, a second electrode and a dielectric layer between the electrodes; at least one electrode line connected to the first electrode of the capacitor; at least one bit line located beneath the gate-acting structure; and the second electrode of said capacitor belonging at least partly to a layer common with at least part of the drain or source second region of the transistor.

The substrate may comprise a silicon-on-insulator-based layer.

The active layer may comprise a lower zone, an intermediate zone and an upper zone, the integrated circuit including a via for connection to one end of a bit line allowing the intermediate zone to be biased. The bit lines may be buried.

The integrated circuit may include an isolating structure, in which circuit an intermediate zone lying between two adjacent gate-acting structures is partly separated into two by a structure, the upper zone immediately in contact with the upper surface of the intermediate zone being completely separated into two by said structure.

The integrated circuit may also include another via for connection to another end of a bit line allowing the lower zone to be biased.

According to another embodiment, a process is defined for fabricating an integrated circuit, in which, on a substrate in an active region comprising a lower zone, an intermediate zone and an upper zone: a transistor is formed, away from the substrate, in the active region by fabricating a source or drain first region in the lower zone, a drain or source second region in the upper zone, the first and second source or drain regions being separated by the intermediate zone, and by creating a gate-acting structure and filling with conducting material a hole converging towards the substrate, said hole being etched in the active region and being covered beforehand with an insulator layer; a capacitor is formed by fabricating a first electrode, the second electrode belonging at least partly to a layer common with at least part of the source or drain second region of the transistor, the insulator layer located between the first electrode and the second electrode forming the dielectric of the capacitor; an electrode line is formed on top of the first electrode of the capacitor; and at least part of the lower zone is used as bit line of the integrated circuit.

The holes and trenches may be etched so that their sidewalls make an angle to the normal to the substrate.

The channel length may be adjusted by modifying the angle at the apex of the corresponding conducting structure and/or the thickness of the intermediate zone.

The following may be formed so as to be self-aligned: at least one transistor comprising a source or drain first region and a drain or source second region respectively, these being connected by a channel and a gate-acting structure; and at least one capacitor, comprising a first electrode, a second electrode and a dielectric layer between said first and second electrodes.

In an embodiment, an integrated circuit comprises: a substrate layer; an overlying semiconductor layer divided into a lower zone of a first conductivity type doping, an intermediate zone of a second conductivity type doping and an upper zone of the first conductivity type doping; a gate structure formed in a cavity within the overlying semiconductor layer having an insulating lining and a conductive filling, wherein the cavity narrows in a width dimension towards the substrate; a first source or drain region formed in the lower zone adjacent the cavity of the gate structure; a second source or drain region formed in the upper zone adjacent the cavity of the gate structure; a capacitor having first and second electrodes and an insulator therebetween wherein the second electrode is formed by the an upper zone of the first conductivity type doping; an electrode line connected to the first electrode of the capacitor; and a bit line located beneath the gate structure.

In an embodiment, a process for fabricating an integrated circuit comprises: forming a semiconductor layer overlying a substrate, the semiconductor layer being divided into a lower zone of a first conductivity type doping, an intermediate zone of a second conductivity type doping and an upper zone of the first conductivity type doping; forming a first cavity in the semiconductor layer which narrows in a width dimension towards the substrate; lining the first cavity with an insulating layer; filling the first cavity with a conductive material forming a gate of a transistor, wherein a first source or drain region is provided in the lower zone adjacent the cavity and a second source or drain region is provided in the upper zone adjacent the cavity; forming a second cavity in the semiconductor layer; lining the second cavity with an insulating layer; filling the second cavity with a conductive material forming a first electrode of a capacitor, a second electrode of the capacitor provided by the upper zone of the first conductivity type doping; forming an electrode line on top of the first electrode of the capacitor; and forming a bit line in at least part of the lower zone of the first conductivity type doping.

BRIEF DESCRIPTION OF THE DRAWINGS

Other features of embodiments of an integrated circuit according to aspects of the invention will become apparent on reading the following description, which is given solely by way of non-limiting example and with reference to the appended drawings in which.

DETAILED DESCRIPTION OF THE DRAWINGS

The integrated circuit is produced on a substrate 1 having the form of a wafer. The steps of the fabrication process make it possible to produce, in parallel, one or more integrated circuits on the surface of the wafer.

Figure 1:
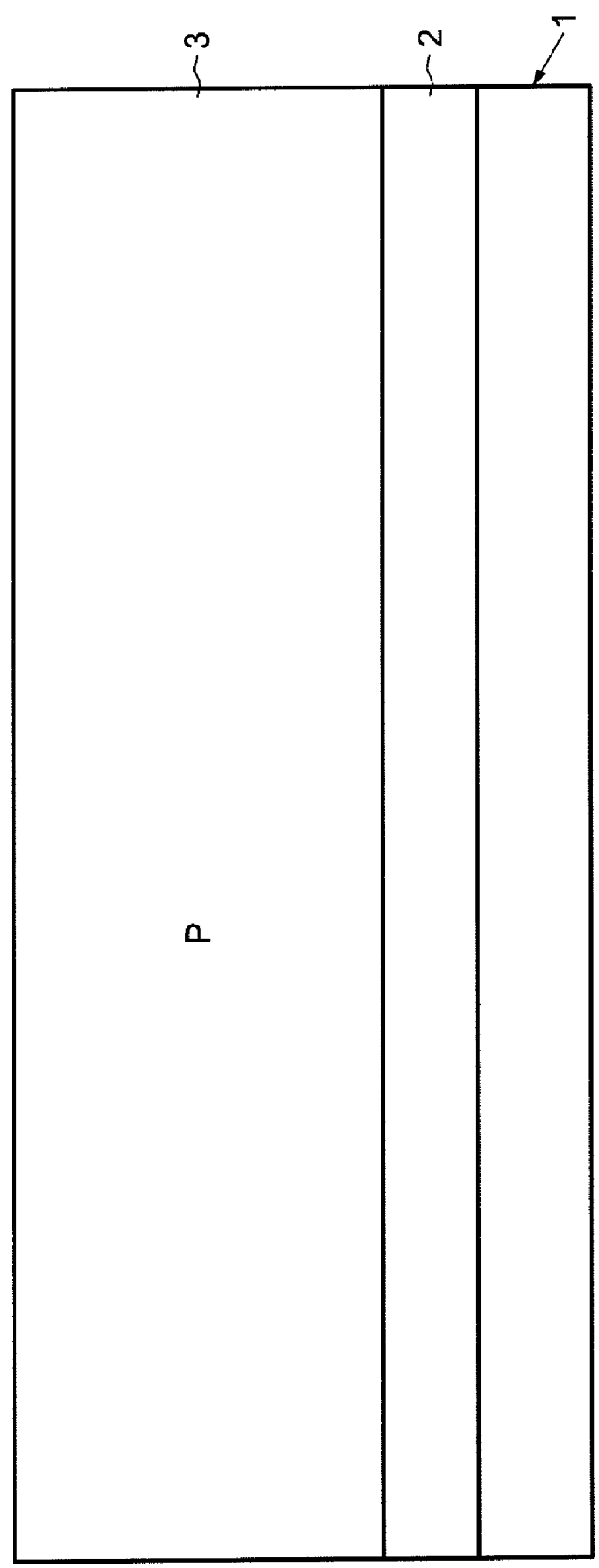
FIGS. 1 to 12 are cross-sectional schematic views of steps of the process for fabricating an integrated circuit.

As illustrated in FIG. 1, a substrate 1 includes an oxide layer 2 placed between two silicon layers. The substrate 1 may be produced by oxidation of a silicon substrate followed by deposition of a silicon-base layer 3 or the use of an SOI (silicon on insulator)-type substrate. Alternatively, the oxide layer 2 may be replaced with a p doped silicon well with a low electron concentration.

Figure 2:
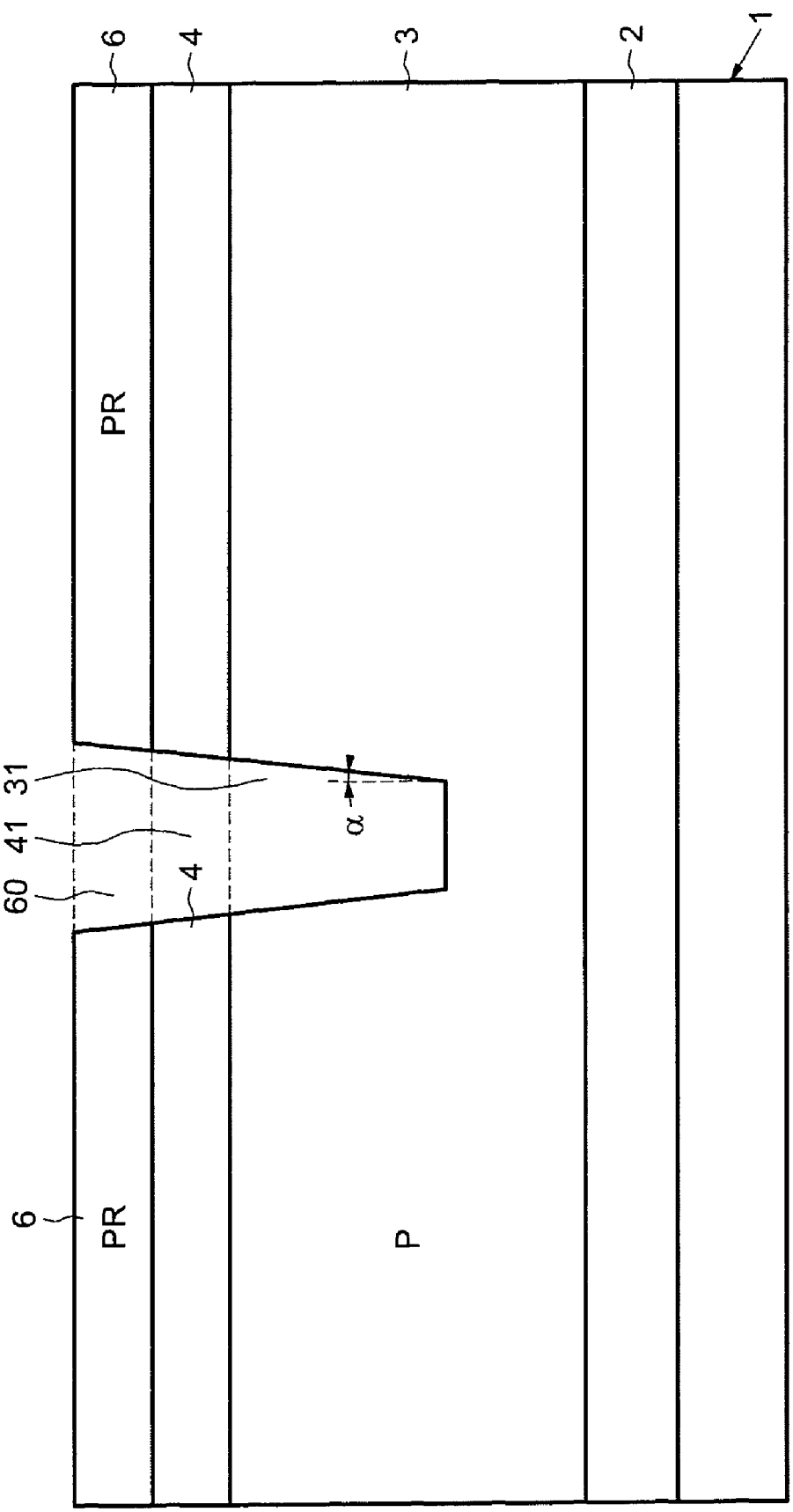

The upper layer 3 undergoes a forming operation as illustrated in FIG. 2. An etch mask 4 is deposited on the upper face of the upper layer 3, covering the entire wafer. The etch mask 4 is a layer resistant to the etching of the upper layer 3, thereby preventing that part of the upper layer 3 on which said resistant layer is deposited from being etched. This may in particular be a silicon oxide or silicon nitride layer. To be able to form the etch mask 4 and increase the resistance to etching, a photoresist layer 6 is deposited. The photoresist layer 6 is formed for example by optical lithography so as to create apertures 60. The etch mask 4 is in turn formed by specifically etching the etch mask 4 through the apertures 60 of the photoresist layer 6. Apertures 41 are then produced in the etch mask 4. The apertures 41 and 60 are vertically aligned and have similar shapes so as to correspond with each other.

An etching operation is carried out on the upper layer 3 through the apertures 60 and 41. This etching is stopped when the bottom of the etching hole is located in the upper layer 3 at a depth between about 25% and 50% of the total thickness of the upper layer 3. The result of this etching is a trench 31 which converges (narrows) towards the substrate and the lateral surfaces of which make an angle α with the normal to the surface of the substrate. The angle α is between about 0° and 30°. Such etching may be carried out for example by the use of anisotropic etching, such as reactive ion etching. The angle α is then controlled by the various etching parameters, including the degree of passivation of the walls.

Figure 3:
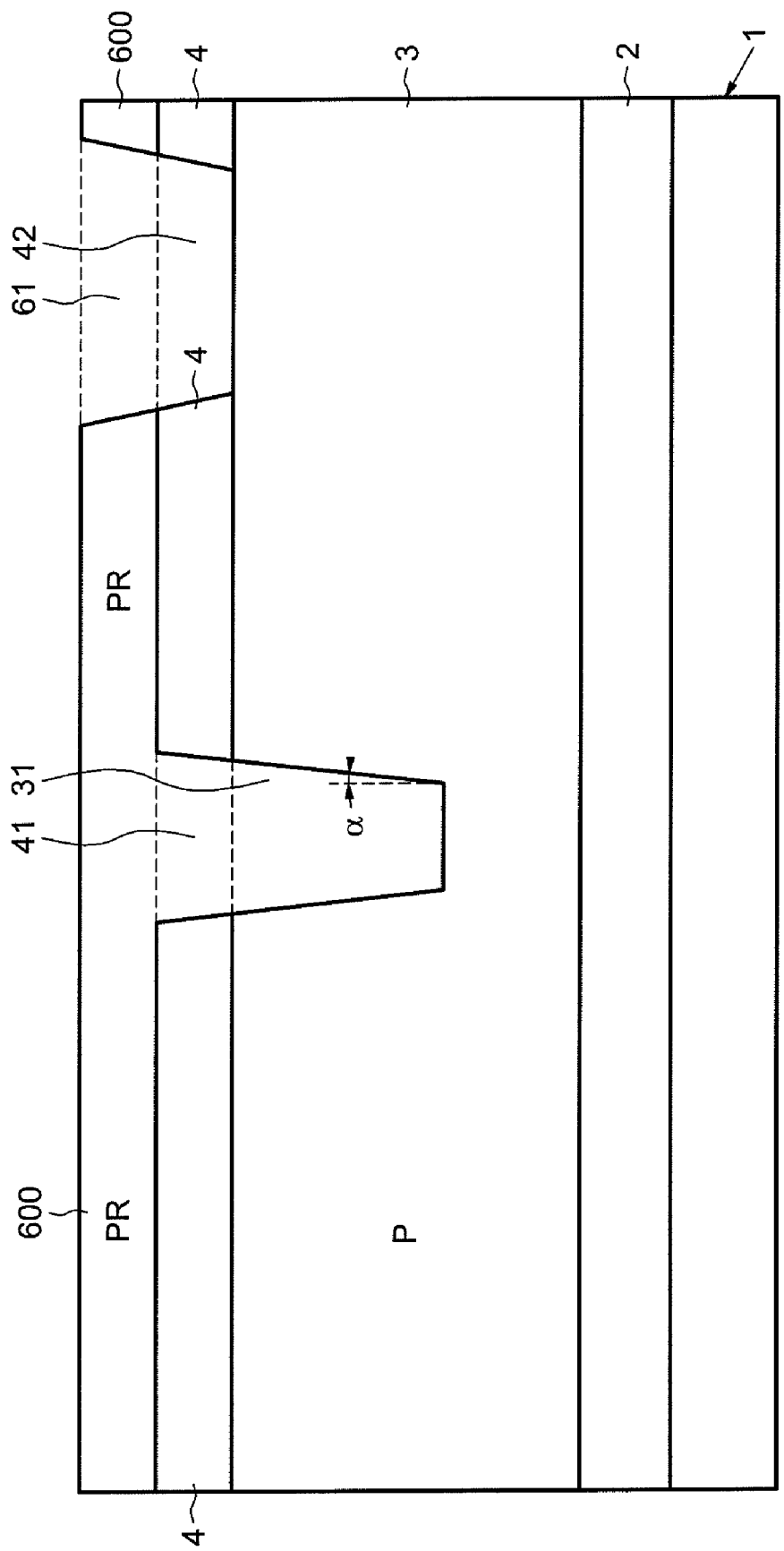

Next, a different production (although close by) is carried out so as to form line ends. In FIG. 3, it may be seen that the photoresist layer 6 has been removed and a new resist layer 600 has been deposited. This new resist layer 600 fills the cavity 41 of the etch mask and the cavity 31 in the upper layer 3. An aperture 61 is made in the photoresist layer 600, for example by photolithography. An aperture 42 is produced in the etch layer 4, for example by acid etching. The apertures 42 and 61 are vertically aligned and have similar shapes so as to correspond with each other.

Figure 4:
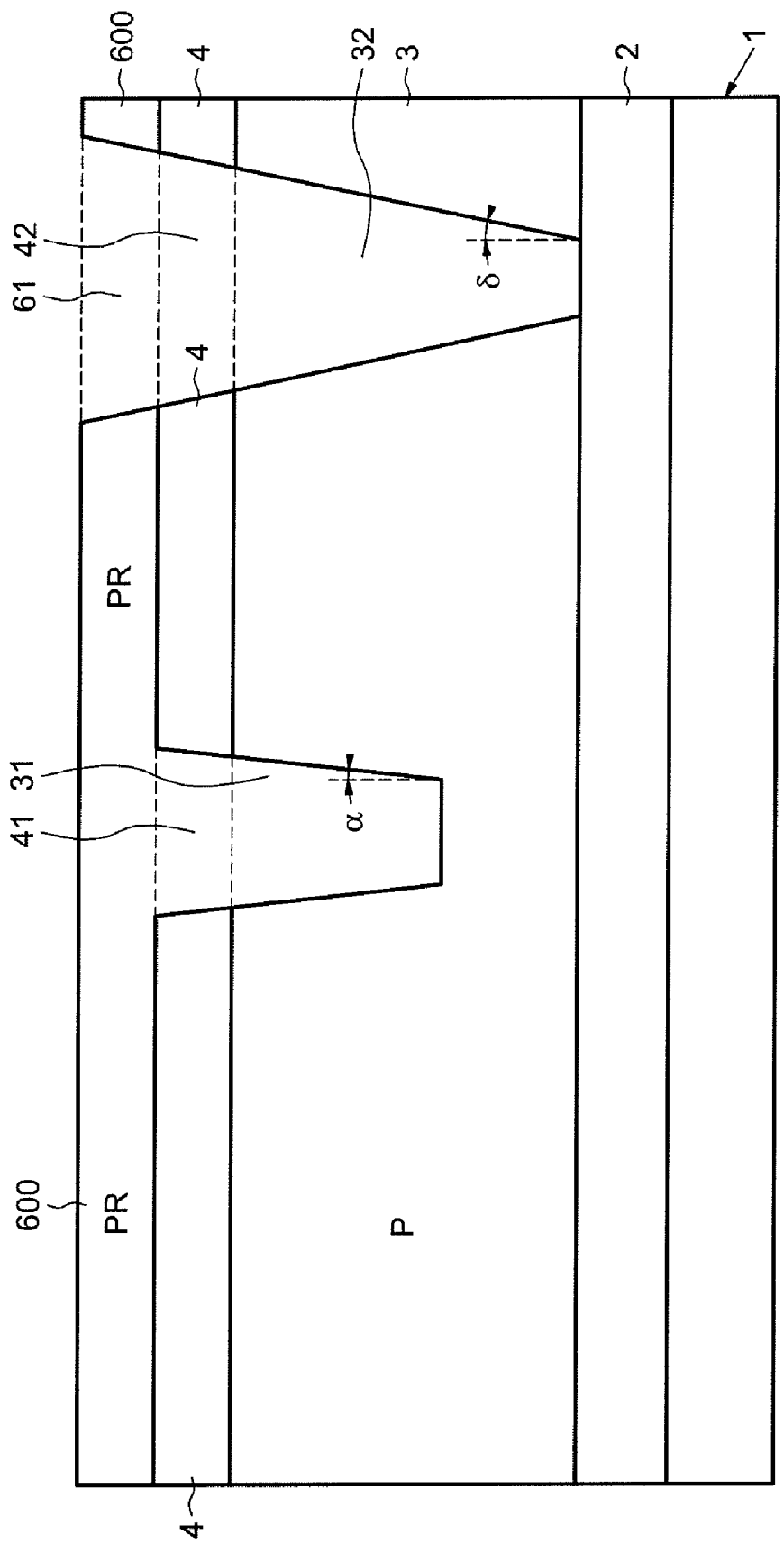

The upper layer 3 is then etched through these two apertures down to the oxide layer 2. The result of this etching, illustrated in FIG. 4, is a trench 32 which converges (narrows) towards the substrate and the lateral surfaces of which make an angle δ with the normal to the surface of the substrate. The angle δ is between about 0° and 30°. Such etching may be carried out for example using anisotropic etching, such as reactive ion etching. The angle δ is then controlled by the various etching parameters, including the degree of passivation of the walls.

FIG. 4 illustrates the creation of a deep end-of-line isolation trench 32, which isolates the end-of-line contact from the immediate environment of the device.

Figure 5:
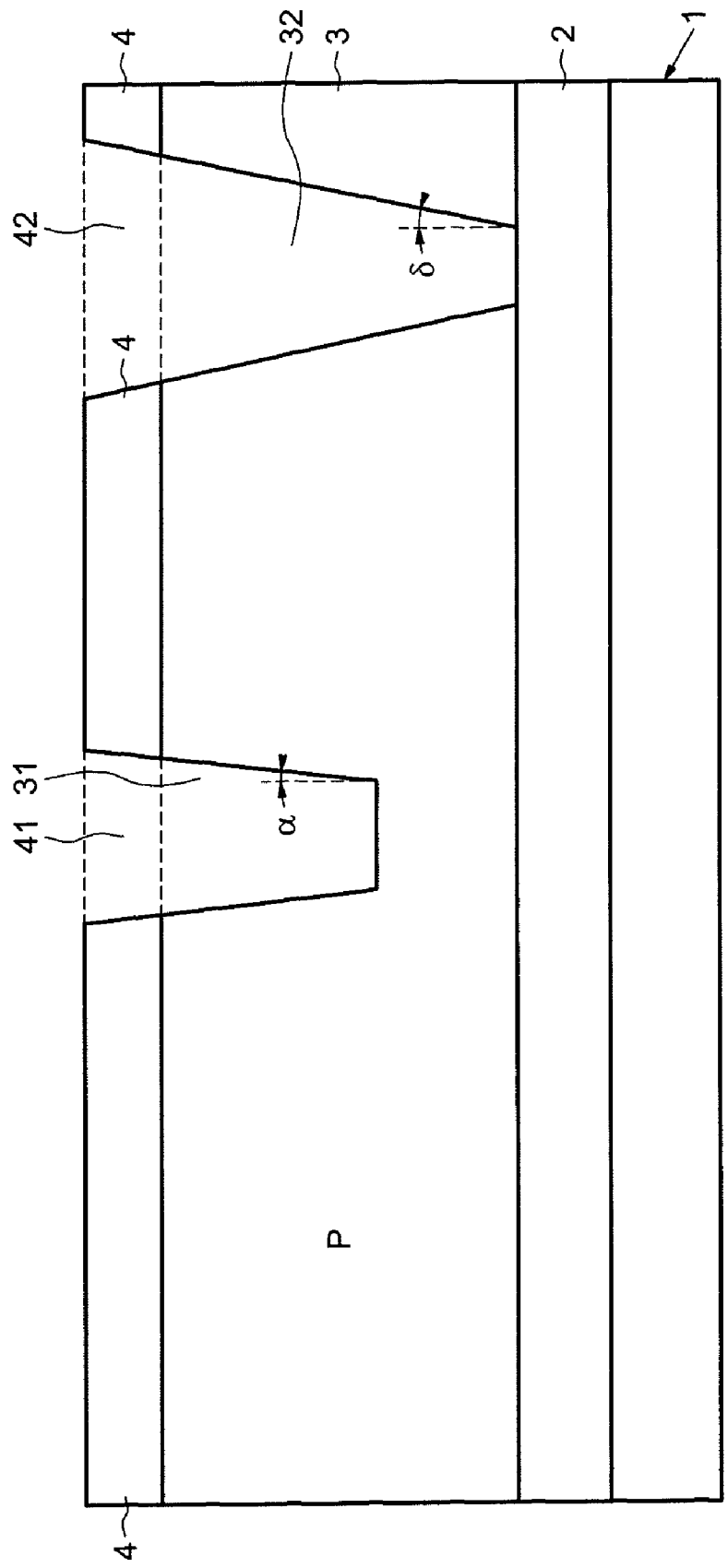

FIG. 5 illustrates a line end as it appears after the partial isolation trench 31 described in FIG. 2 has been etched and after the deep isolation trench 32 described in FIGS. 3 and 4 has been etched. The photoresist layer 600 has been removed, but the etch mask 4 is still present.

Figure 6:
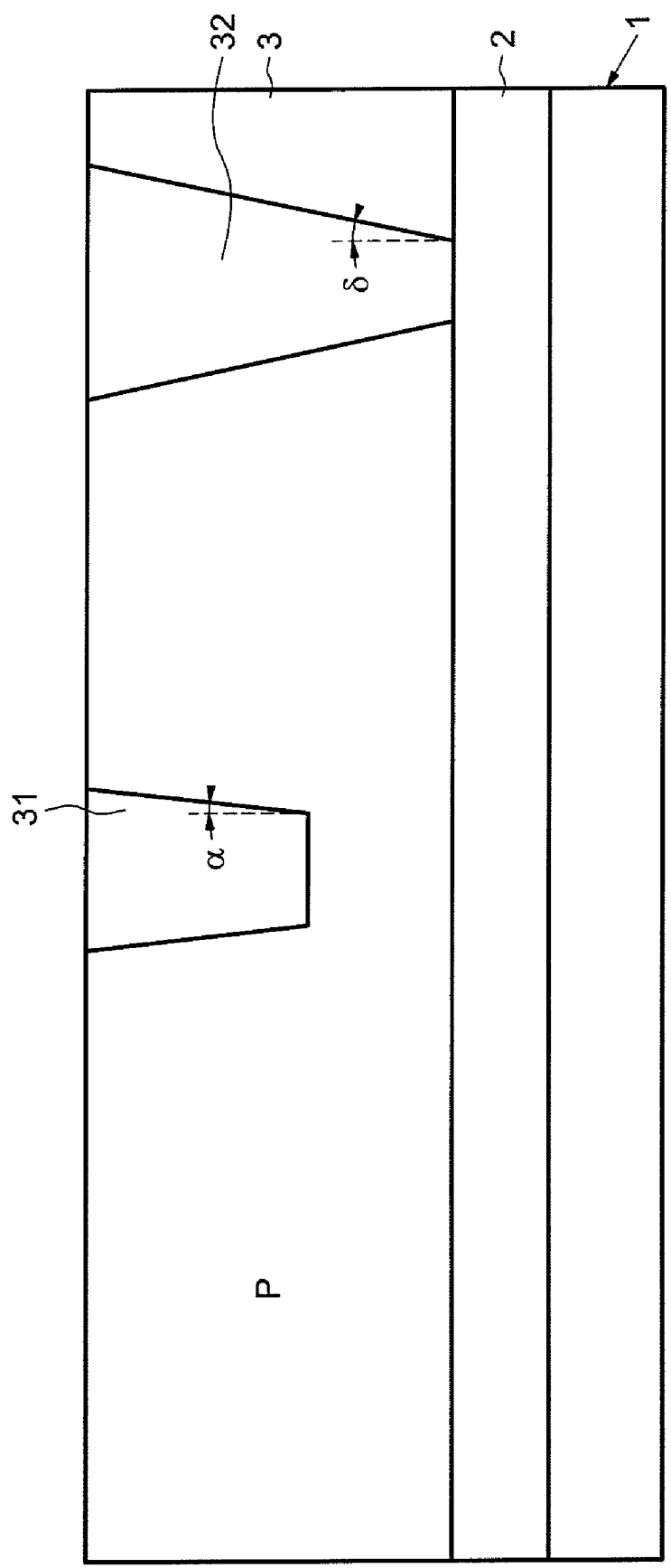

FIG. 6 shows the result of filling the partial isolation trenches 31 and the deep isolation trench 32. This filling may for example be carried out by depositing, by sputtering or evaporation, of silicon oxide over the entire wafer. The two trenches are thus filled simultaneously. The etch mask 4 is used to limit the areas on which the deposition is carried out. Upon removing the mask, the surfaces of the upper layer 3 with which it was in contact, are devoid of any deposited material. After the etch mask 4 has been removed, a chemical-mechanical polishing operation completes the step.

The fact that the partial isolation trench 31 and the deep isolation trench 32 may share a step, at least partly simultaneously, allows the process described in a conventional CMOS production process to be easily integrated. Such an additional lithography mask is needed for producing the partial isolation trenches 31. The lithography mask used for producing the apertures in the photoresist layer, so as to etch the deep isolation trenches 32, may be integrated into the mask for producing the deep isolation trenches of a CMOS device. By using the already existing etch mask 4 it is possible to reduce the costs. Likewise, by simultaneously filling the partial isolation trench 31 and deep isolation trench 32 it is possible to reduce the costs further. The creation of on-board memories is thus simplified and their cost reduced.

Figure 7:
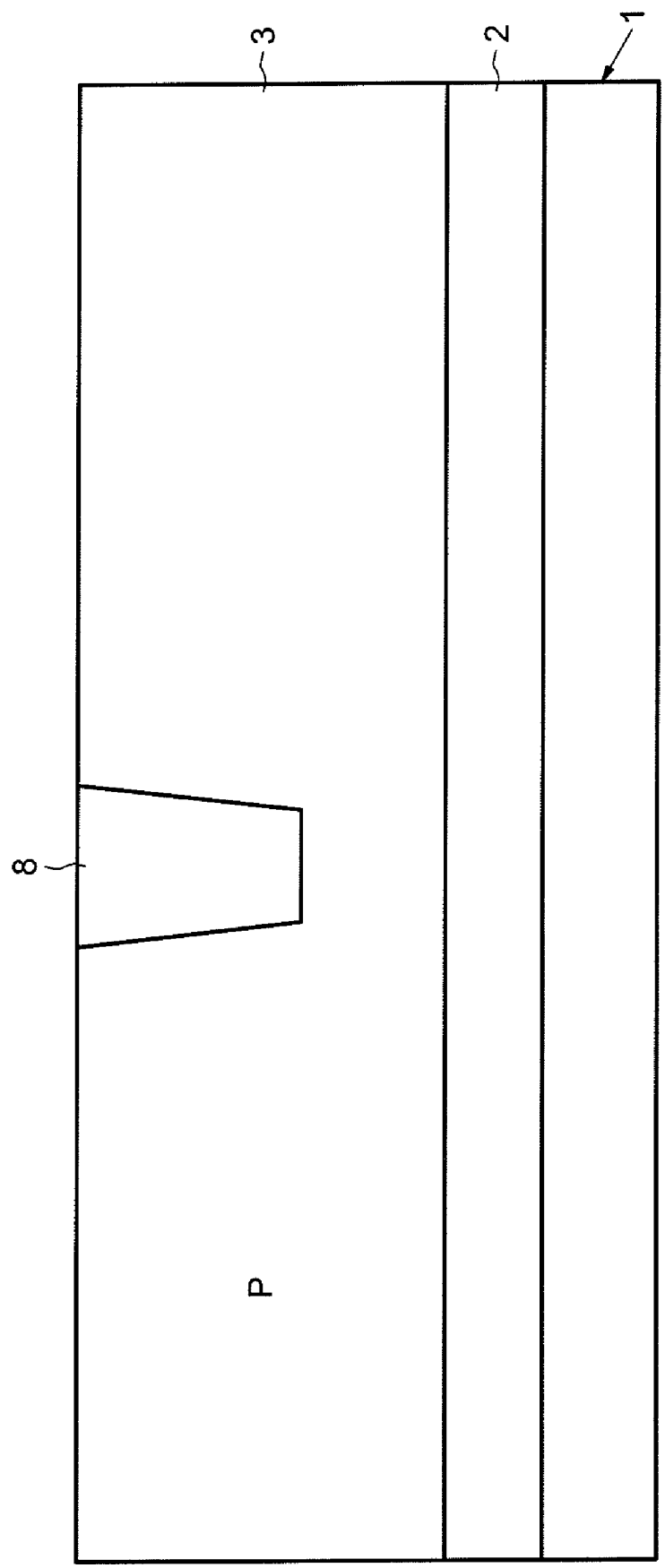

The production of the devices present between the line ends takes place in parallel with the steps described above. Some of the steps described above will be described again here in order to specify their role and their sequence. The steps with the same name are common. The process continues after the photoresist layer 600 has been removed. The deposition of an insulator makes it possible here to produce the structure 8. An insulator layer is also deposited on the etch mask 4. The etch mask 4 is then removed together with the silicon oxide that was deposited away from the structure 8. FIG. 7 shows the result after removal of the etch mask 4. The structure 8 may be completed by chemical-mechanical polishing or anisotropic etching of the insulator.

The next step is the implantation 90 of various species for creating the active region within the upper layer 3. By modulating the implantation parameters, two zones are formed.

A lower n+-doped zone 9, which is located so as to be in contact with the upper face of the oxide layer 2 and the thickness of which is between about 40% and 60% of the distance between the lower face of the structure 8 and the upper face of the oxide layer 2, is formed.

Figure 8:
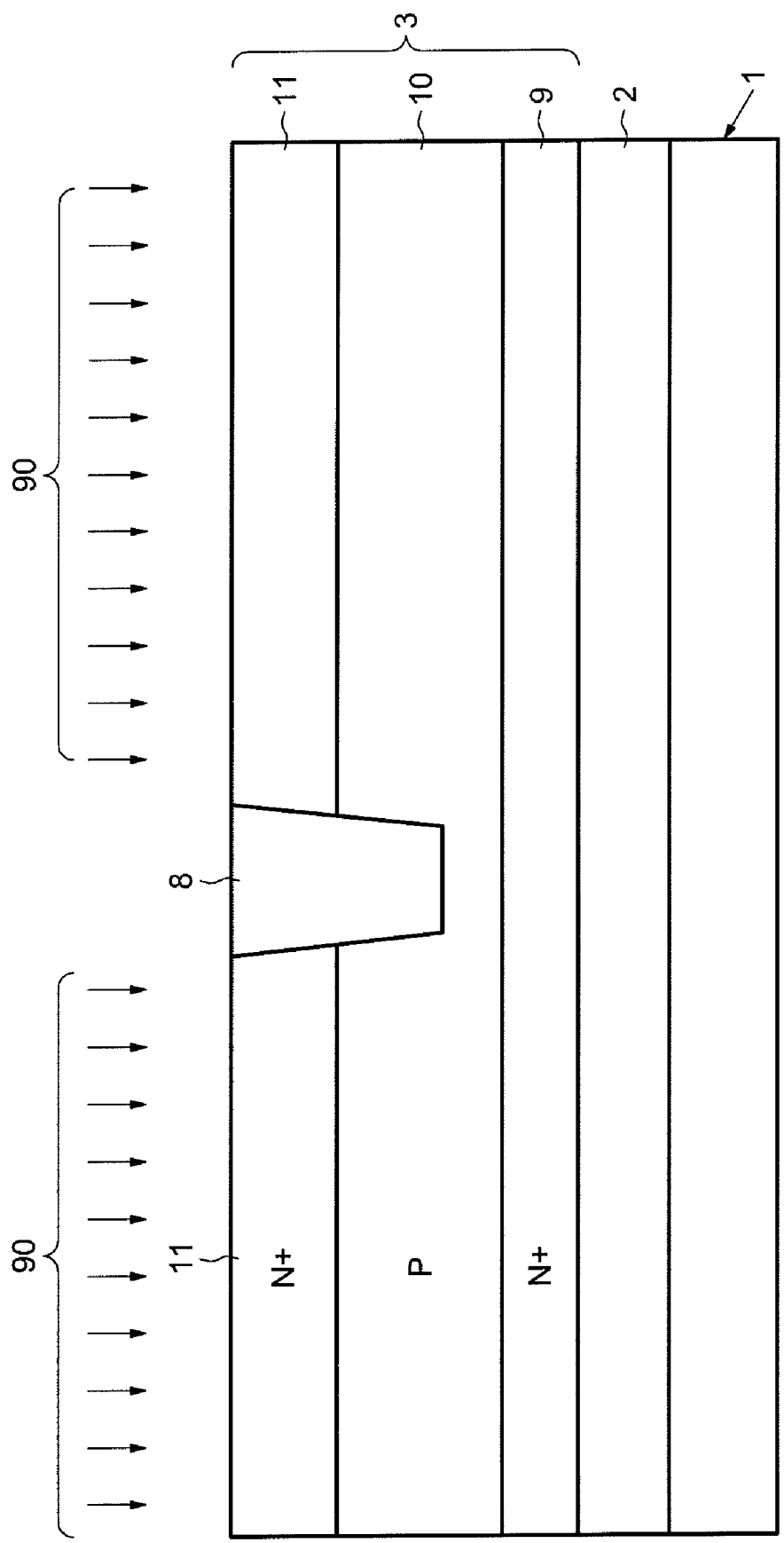

An upper n+-doped zone 11 is also formed in the upper layer 3. The upper surface of the upper zone 11 corresponds to the upper surface of the upper silicon layer 3. The thickness of the upper zone 11 is between about 40% and 60% of the height of the structure 8. The upper face of the lower zone 9 and the lower face of the upper zone 11 define a p-doped intermediate zone 10. The result of this step is illustrated by FIG. 8.

Figure 9:
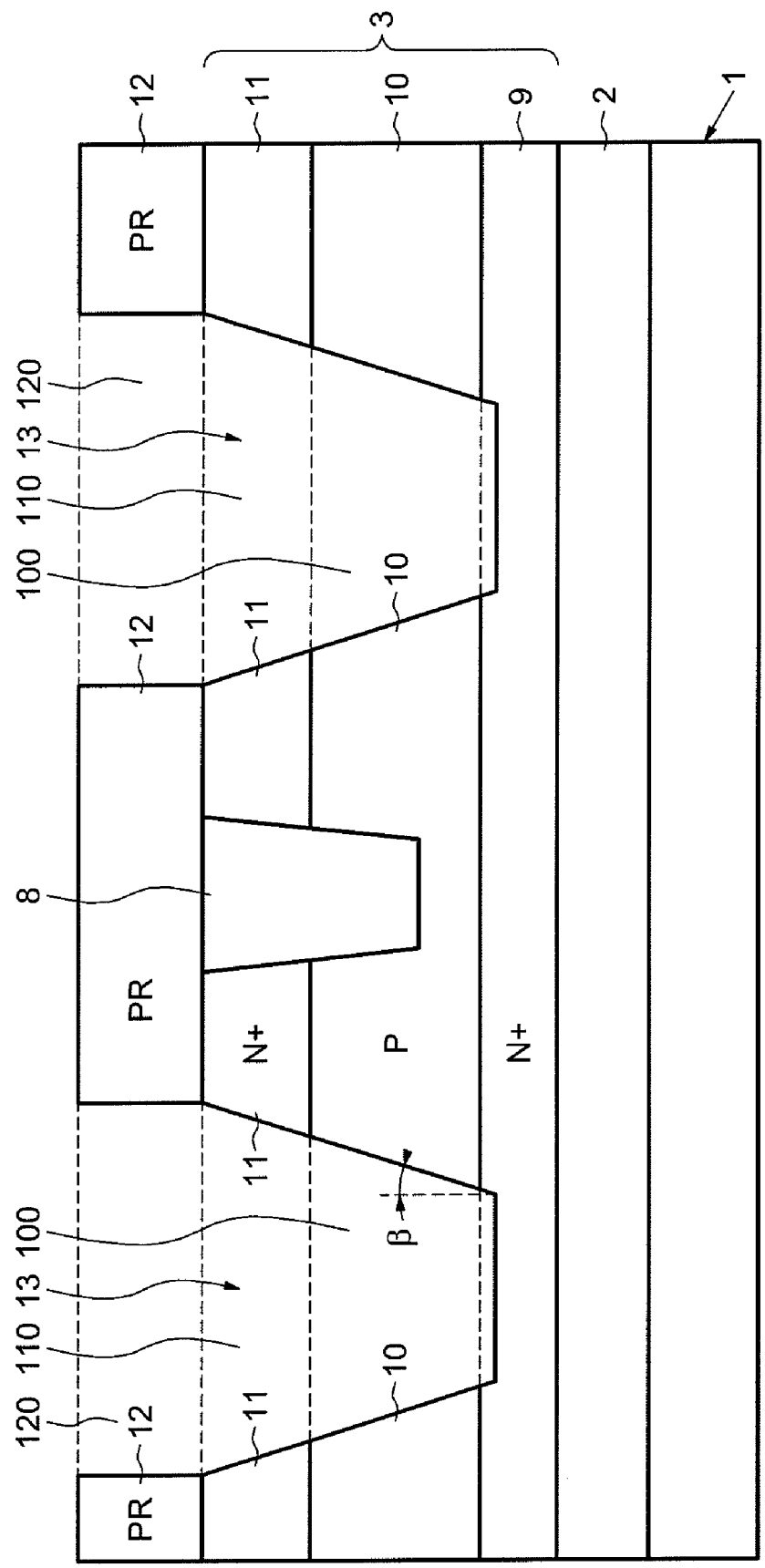

The next step is the etching of the cavities 13 in the upper layer 3. A photoresist layer 12 is deposited over the entire wafer and the apertures 120 are etched therein by photolithography. A structure 8 is located between two apertures 120. The photoresist layer 12 serves as etch mask for etching the cavities 13. A cavity 13 is formed by etching the zones 10 and 11, forming a hole 110 passing through the upper zone 11 and a hole 100 passing through the intermediate zone 10. The etching is stopped when said hole has passed through the entire intermediate zone 10 (perhaps entering slightly into the layer 9). The cavity 13 comprises lateral surfaces making an angle β to the normal to the surface of the substrate. The angle β may be between about 0° and 30°. The result of this step is illustrated by FIG. 9.

Figure 10:
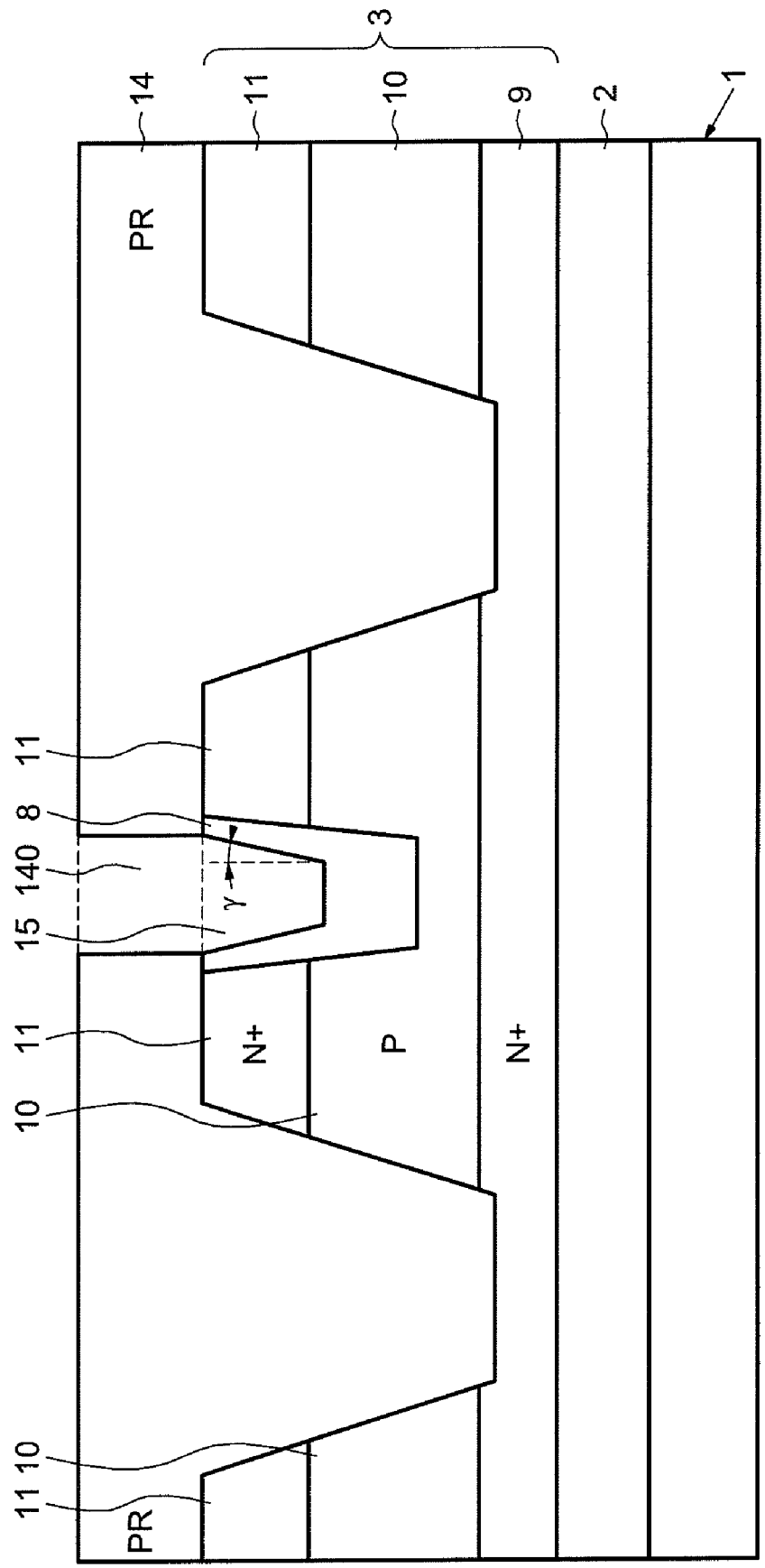

The next step of the process is illustrated in FIG. 10. The photoresist layer 12 is removed and a photoresist layer 14 is deposited on the wafer so as to cover all the reliefs. Apertures 140 aligned with the structures 8 are produced in the photoresist layer 14, for example by photolithography. The widths of the apertures 140 are smaller than the width of the upper face of the structures 8. A trench 15 is etched in the structure 8. A trench 15 comprises lateral surfaces converging towards the substrate, making an angle γ to the normal to the substrate. The angle γ may be between about 0° and 30°. A trench 15 has a depth of between about 40% and 60% of the thickness of the structure 8.

Figure 11:
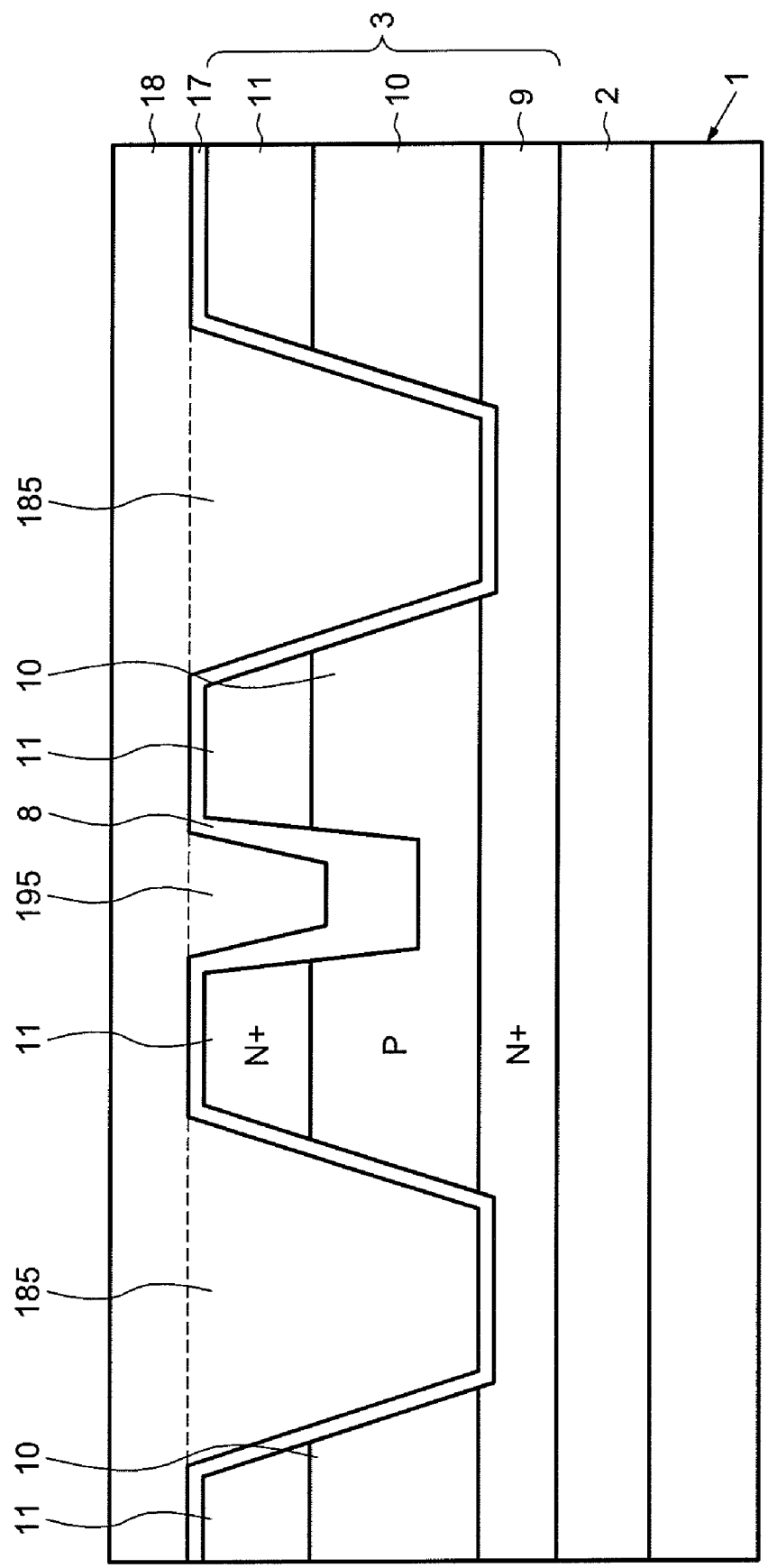

The next step is illustrated by FIG. 11. The photoresist layer 14 is removed and an oxide layer 17 is deposited conformally on the wafer so as to cover and conform to all the reliefs. The thickness of this oxide layer 17 is a few nanometers. It should be noted that the oxide present on the surface of the silicon may be removed so as to obtain a high-quality silicon oxide. The removal of the oxide may, for example, be carried out using a solution based on hydrofluoric acid. A conducting layer 18, for example made of polysilicon, is deposited on the entire wafer so as to obtain a planar final surface irrespective of the relief present beneath the layer. Such a layer has, in the least thick zones, a thickness between about 20% and 40% of the thickness of the upper layer 3. During deposition of the conducting layer 18, the holes 13 and the trench 15 are also filled (see, FIGS. 9 and 10). The structure 185 is formed by filling a hole 13 and the structure 195 is formed by filling a trench 15. The dashed lines separate the structures 185 and 195 from the layer 18. In all the following FIGURES, the dashed lines mark a functional separation and not a structural separation. The dashed lines are indicated merely for clarity of the drawing.

Figure 12:
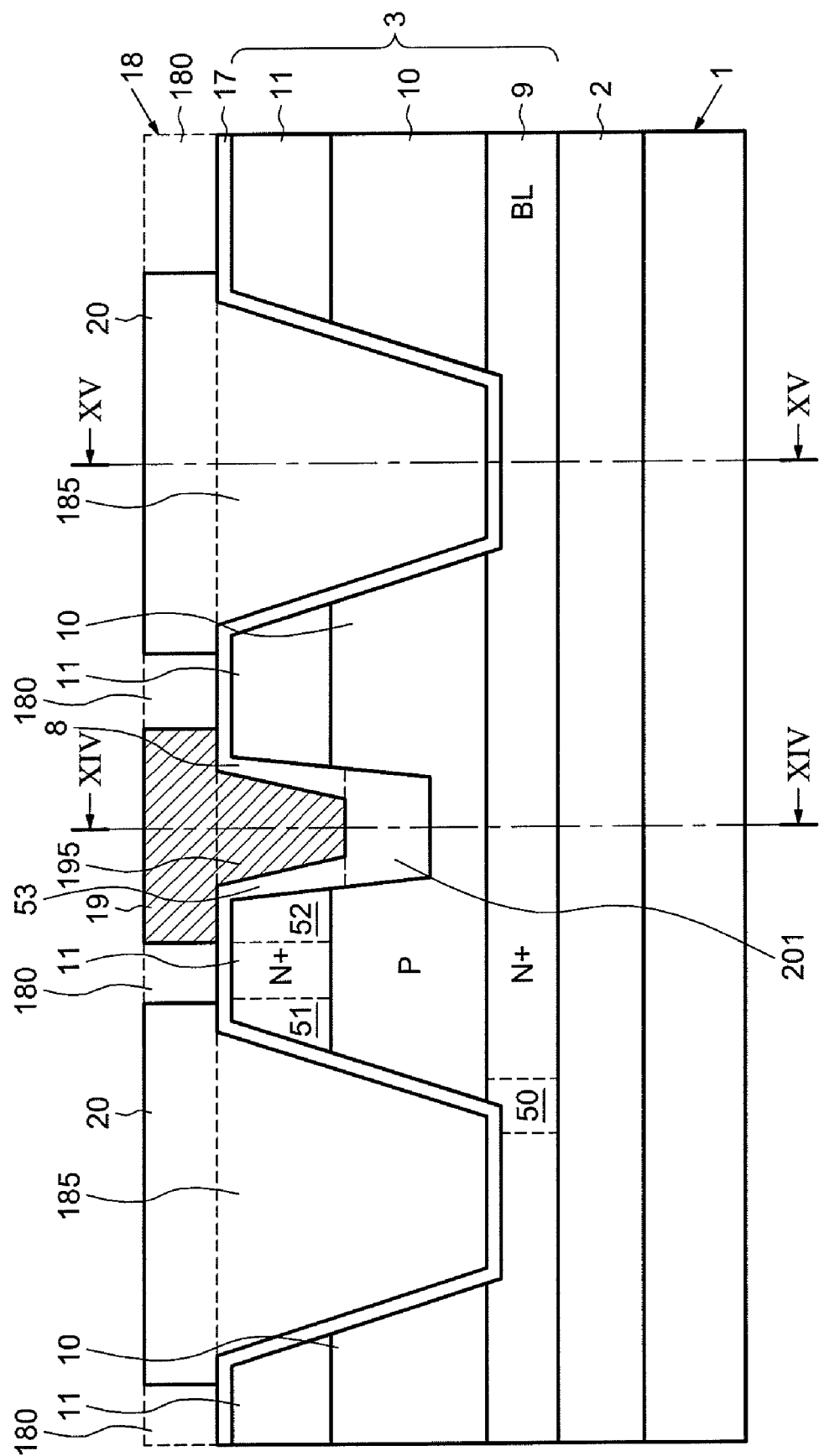

During the step described in FIG. 12, the conducting layer 18 is etched so as to produce a set of lines. The etching is carried out using a photoresist mask (not shown) in which apertures vertically aligned with the spaces 180, and having similar shapes, are produced. The apertures are positioned in such a way that the etched spaces 180 are located between the structures 195 and 185. These spaces 180 have a width of between about 50% and 80% of the distance between one end of the upper face of a structure 195 and the end closest to the upper face of the closest structure 185. The apertures 180 form lines on the wafer and define conducting lines 19 covering structures 195 and conducting lines 20 covering structures 185. The conducting line 19 is called an electrode line and the conducting line 20 is called a word line. The word lines and electrode lines are self-aligned with the gates of the transistors. It should be noted that the structuring steps described in FIGS. 8 and 9 may be carried out simultaneously with steps for structuring the gate of conventional CMOS transistors.

Figure 14:
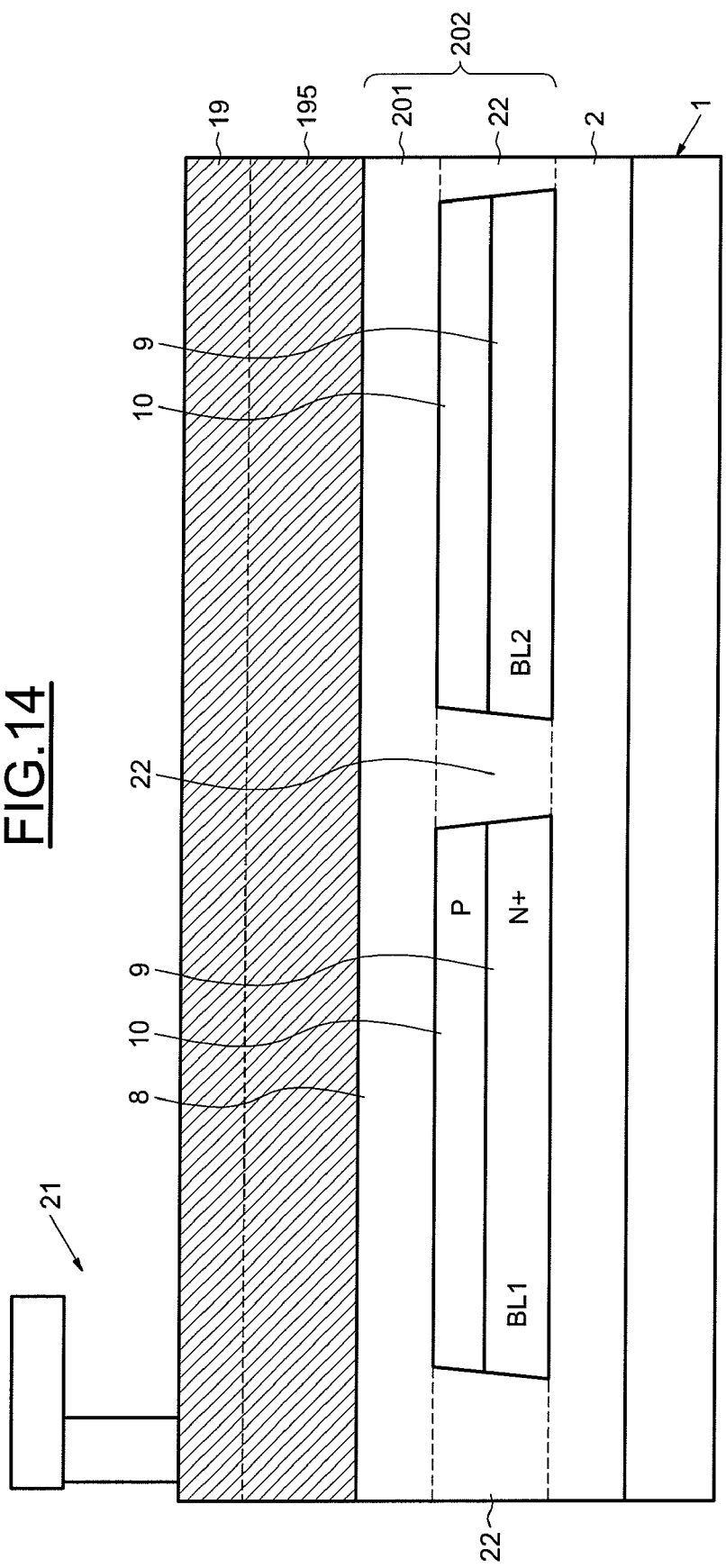
FIG. 14 illustrates a cross-sectional view in the XIV-XIV plane of FIG. 12.
Figure 15:
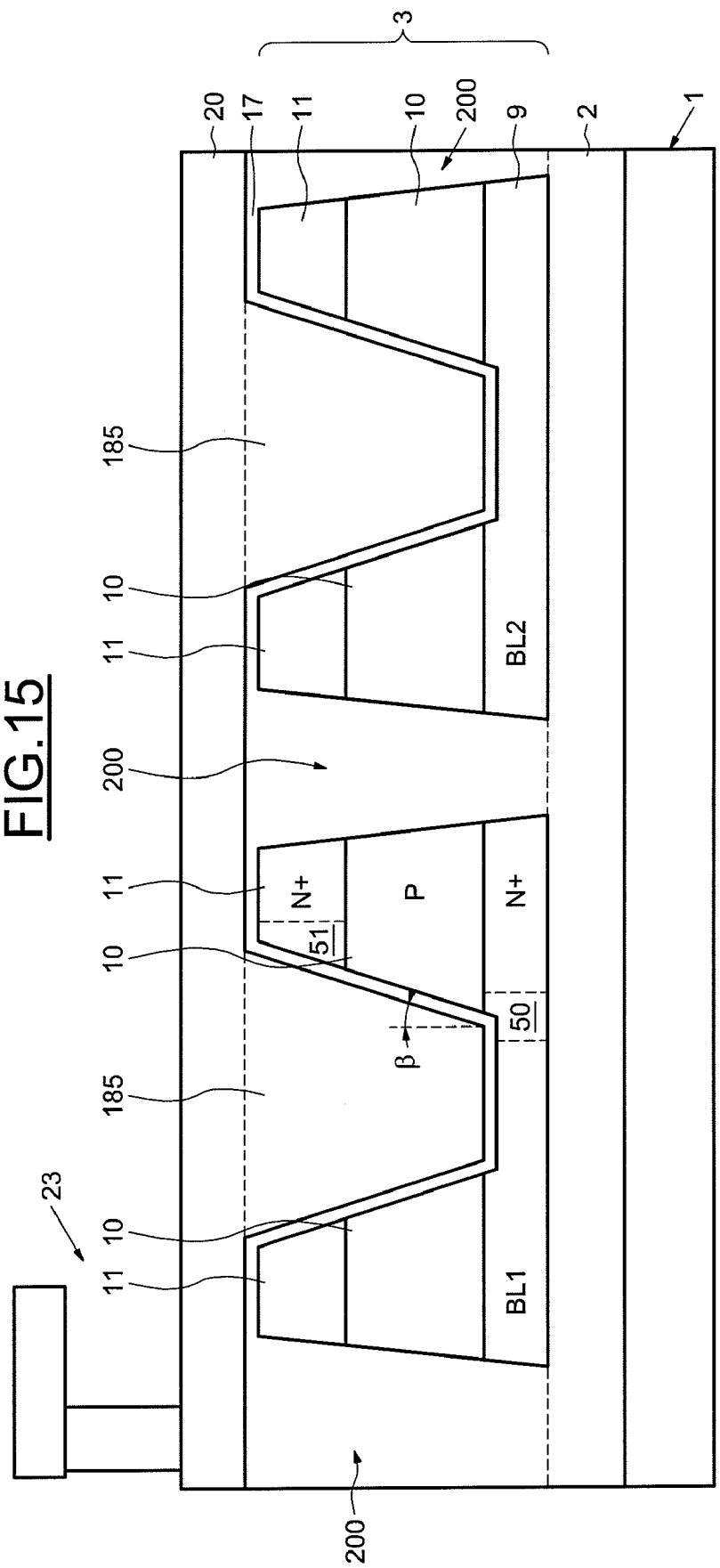
FIG. 15 illustrates a cross-sectional view in the XV-XV plane of FIG. 12.

FIG. 12 also shows the various indications in which the cross-sectional views of the device are taken so as to obtain FIGS. 14 and 15. FIG. 14 is a cross-sectional view in the XIV plane. The XIV plane is vertical, perpendicular to the surface of the substrate, and passes through the middle of an electrode line 19 and through the middle of the upper surface of a structure 195. FIG. 15 is a cross-sectional view on the XV plane. The XV plane is parallel to the XIV plane, perpendicular to the upper surface of the substrate, and passes through the middle of a word line 20 and the middle of the corresponding structure 185. The structure 8 comprises a structure 201 located between the lower face of the structure 195 and the lower face of the structure 8.

Transistors are formed by the combination of the zones 9, 10 and 11, the insulation 17 and a structure 185. The structure 185 is used to control the channel between the source or drain region 50 (in layer 9) and the drain or source region 51 (in layer 11), respectively. Depending on the voltage applied to the gate, and therefore to the corresponding word line 20, the transistor will permit or not permit charges to be transferred between the zones 9 and 11 by opening or closing the channel.

The upper zone 11, the structure 195 and the isolating layer 53 form a capacitor. The structure 195 is maintained at a constant potential by means of the electrode line 19. Depending on the bias of the word line 20 and that of the bit line BL, the assembly formed by the transistor and the capacitor will store information, in the form of a charge present or absent in the upper zone 11.

Figure 13:
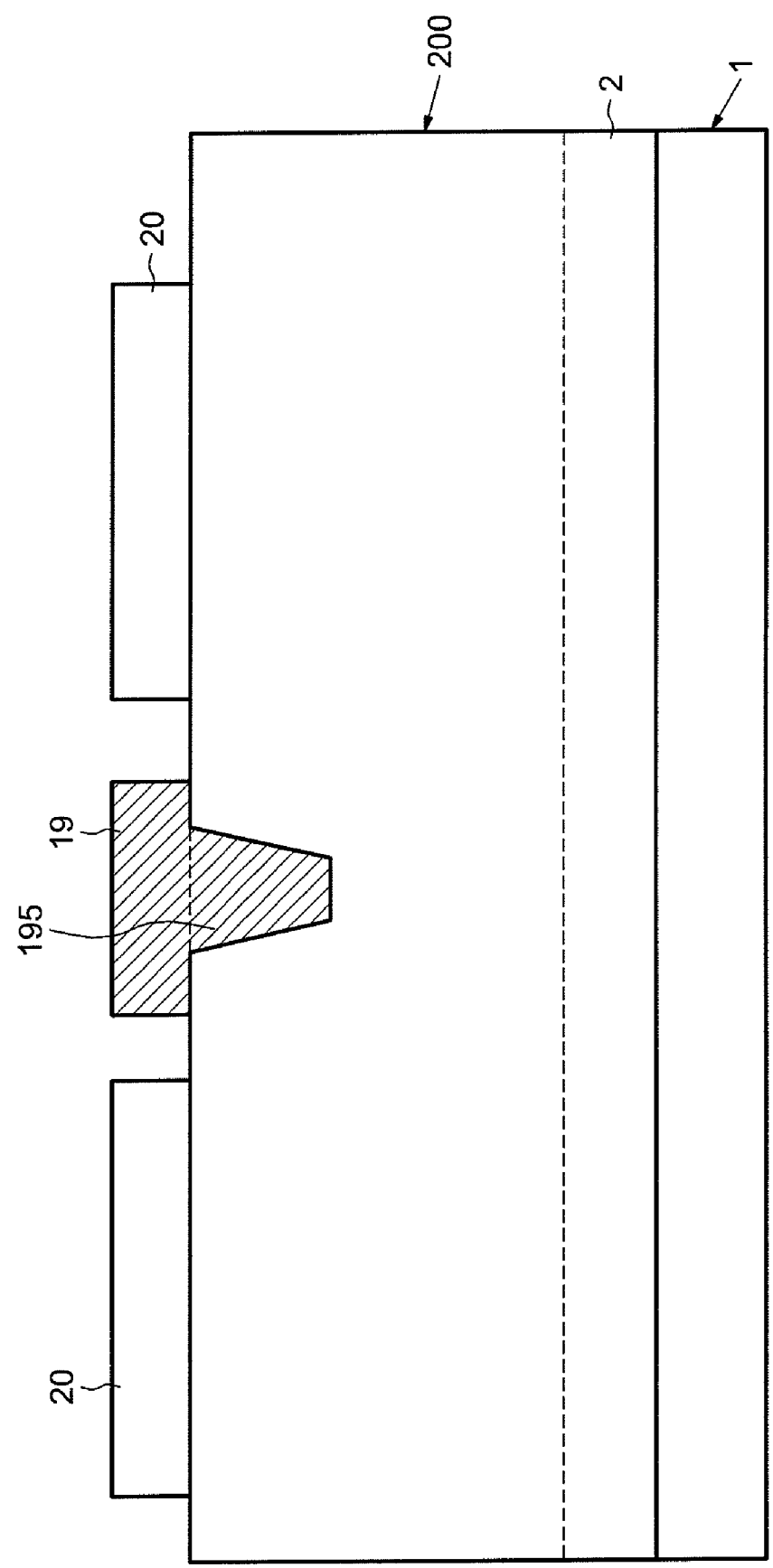
FIG. 13 illustrates a schematic view of the integrated circuit in cross section along the bit line in a lateral isolation trench.

FIG. 13 shows a cross-sectional view of the device in a plane parallel to the plane of section of FIG. 12, in the insulation between two bit lines BL. On the silicon substrate 1 and the insulation layer 2 there is an insulation layer 200, the thickness of which corresponds to the sum of the thicknesses of the layers 3 and 17 of FIG. 12. It may be seen in this insulation layer 200 that there is an electrode line 19 and a word line 20, corresponding to the electrode 19 and word 20 lines of FIG. 12. These two lines are positioned at constant interval and are isolated from each other. A cross section of the structure 195 is visible below the electrode line 19. The structure 195 is continuous between the planes of section of FIGS. 12 and 13.

FIG. 14 shows a cross-sectional view of the device in the XIV plane depicted in FIG. 12. This FIG. 14 shows the silicon substrate 1 on which there is an oxide layer 2 and a layer 202, the thickness of which corresponds to the distance between the lower face of the structure 195 and the upper face of the oxide layer 2. The layer 202 comprises a continuous oxide layer 201 in contact with the lower face of the structure 195. The layer 202 also comprises, between the lower face of the layer 201 and the upper face of the layer 2, an alternation of structures 22 consisting of insulation and of vertically superposed parts of the lower zone 9 and of the intermediate zone 10 having the same thickness as a structure 22. The insulation layer 201 separates the structure 195 from the parts of the intermediate layer 10. The reference 21 denotes a contact for the electrode line 15.

It may be clearly seen in this FIG. 14 that parallel bit lines, denoted here by BL1 and BL2, are isolated from each other by the isolation zone 22.

FIG. 15 shows a cross-sectional view of the device in the XV plane. On a silicon substrate 1 surmounted by an oxide layer 2 there are a lower n+-doped zone 9, an intermediate p-doped zone 10 and an upper n+-doped zone 11. These three zones are partly separated by insulation layers 200. The insulation layers 200 correspond to the layers having the same reference in FIG. 13. The upper zone 11 and the intermediate zone 10 are again divided up by the structures 185. The structures 185 are separated from the zones 9, 10 and 11 by an insulation layer 17 corresponding to the layer with the same number visible in the previous FIGURES. The reference 23 denotes a contact for the word line 20.

This FIG. 15 shows at least one transistor comprising source and/or drain regions 50 and 51 separated from the structure 185 by an insulator 17. A channel (not shown) connects the source and/or drain regions 50 and 51 close to the layer 17 in the intermediate zone 10. The channel is electrostatically controlled by the gate-acting structure 185 of the transistor. The structure 185 is voltage-biased by the word line 20. A transistor will thus control the flow of charge from the upper zone 11 into the lower zone 9, or conversely. Since the lower zone 9 is also a bit line, the transistor thus defined controls the read-out or writing of the data. It may also be seen in this FIG. 15 that the parallel bit lines BL1 and BL2 are isolated from each other by the insulation layer 200.

In other words, when a voltage is applied to the bit line 20, a field effect appears between the gate-acting structure 185 and the channel of the transistor, this appearing in the intermediate zone 10 between the zones 9 and 11. Used in combination with one or other of the biased bit lines BL1 and BL2, the word line makes it possible to store or read out information contained in the capacitor connected to the transistor controlled by the activated word line.

The angle β of the lateral surfaces of the structure 185 to the normal to the surface of the substrate defines the length of the channel between the zones 9 and 11 of the transistor, together with the thickness of the intermediate zone 10.

Figure 16:
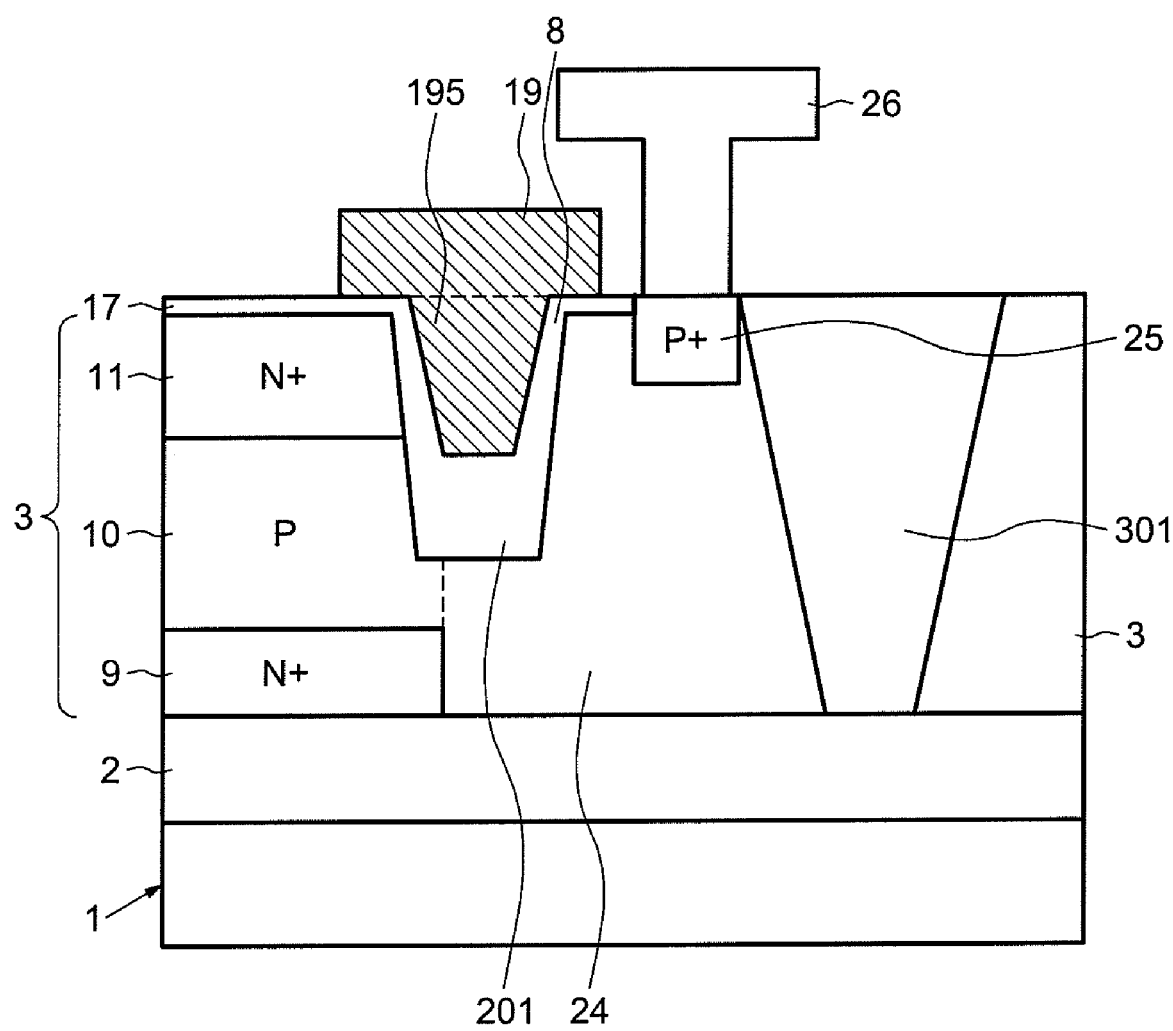
FIGS. 16 and 17 are cross-sectional views in the plane of section of FIGS. 1 to 11.

FIG. 16 shows one end of a bit line visible in FIG. 12. The zones 9, 10 and 11 described above may again be seen on a substrate 1 surmounted by an oxide layer 2. The FIG. 16 shows the final memory cell along the bit line in question. The two zones 9 and 11 are stopped at the end of the final cell. The final cell terminates in a capacitor. The intermediate zone 10 is in contact with a structure 24 which occupies a thickness equivalent to the thickness of the upper layer 3. Since the structure 24 is p-doped, like the intermediate zone 10, it comprises a p+-doped layer 25 for producing the interface with a surface contact 26. The production of the doped layer 25 requires a specific mask. The structure 24 and the layer 25 share a common upper surface. Thus, a voltage applied to the contact 26 does not experience the effect of a high contact resistance at the interface between the metal and the p-doped silicon. A deep isolation trench 301 allows the system to be isolated from external interference. The deep isolation trench 301 is formed in accordance with the steps described in FIGS. 3 to 6, part of the layer 3 also being visible. This layer 3 may for example be an inactive part not belonging to any device—a residue of the various fabrication steps—or an active part comprising lower 9, intermediate 10 and upper 11 layers (not shown) which are intended for the fabrication of other devices, for example memories or CMOS devices.

Figure 17:
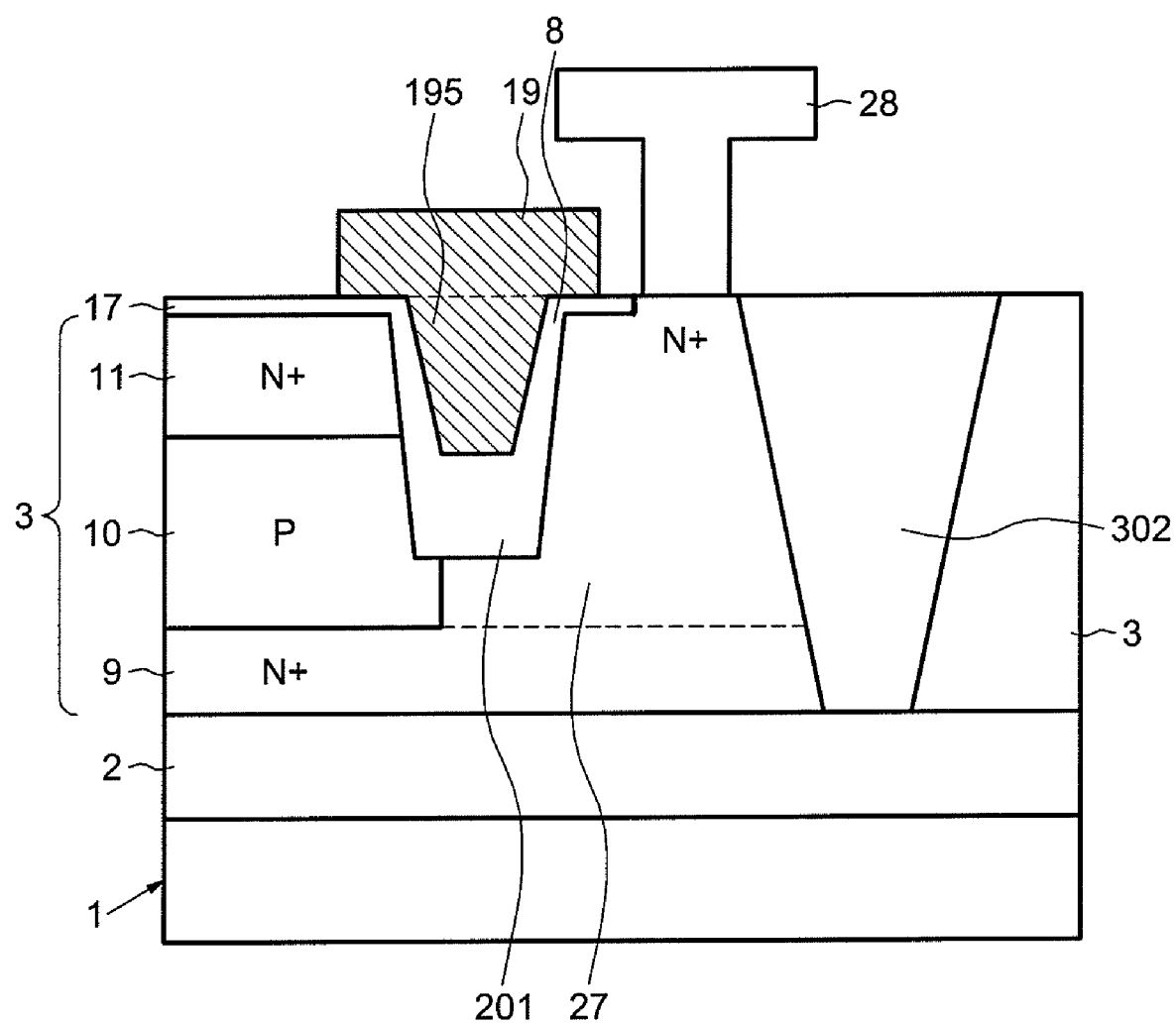

FIG. 17 shows another end of a bit line visible in FIG. 12. The zones 9, 10 and 11 described above, which form the final cell of the bit line, are again shown on a substrate 1 surmounted by an oxide layer 2. The two zones 10 and 11 are stopped on the structure 195 of the capacitor of the final cell. The lower zone 9 extends beyond the vertical passing through the structure 195. That part of the lower zone 9 beyond the vertical passing through the structure 195 is surmounted by a structure 27. Said structure 27 occupies a thickness equivalent to the thickness of the zones 10 and 11. This structure 27, since it is n+-doped like the lower zone 9, is directly connected to a contact 28 on the surface. The production of the structure 27 requires a specific lithography mask. A layer 302 isolates the system from external interference. The deep isolation trench 302 is also formed in accordance with the steps described in FIGS. 3 to 6, part of the layer 3 also being visible. The comments applying to FIG. 16 also apply here.

It should be noted that the structures 200, 301 and 302 are at least partly in contact with one another, the sum of these structures forming a continuous overall structure.

Figure 18:
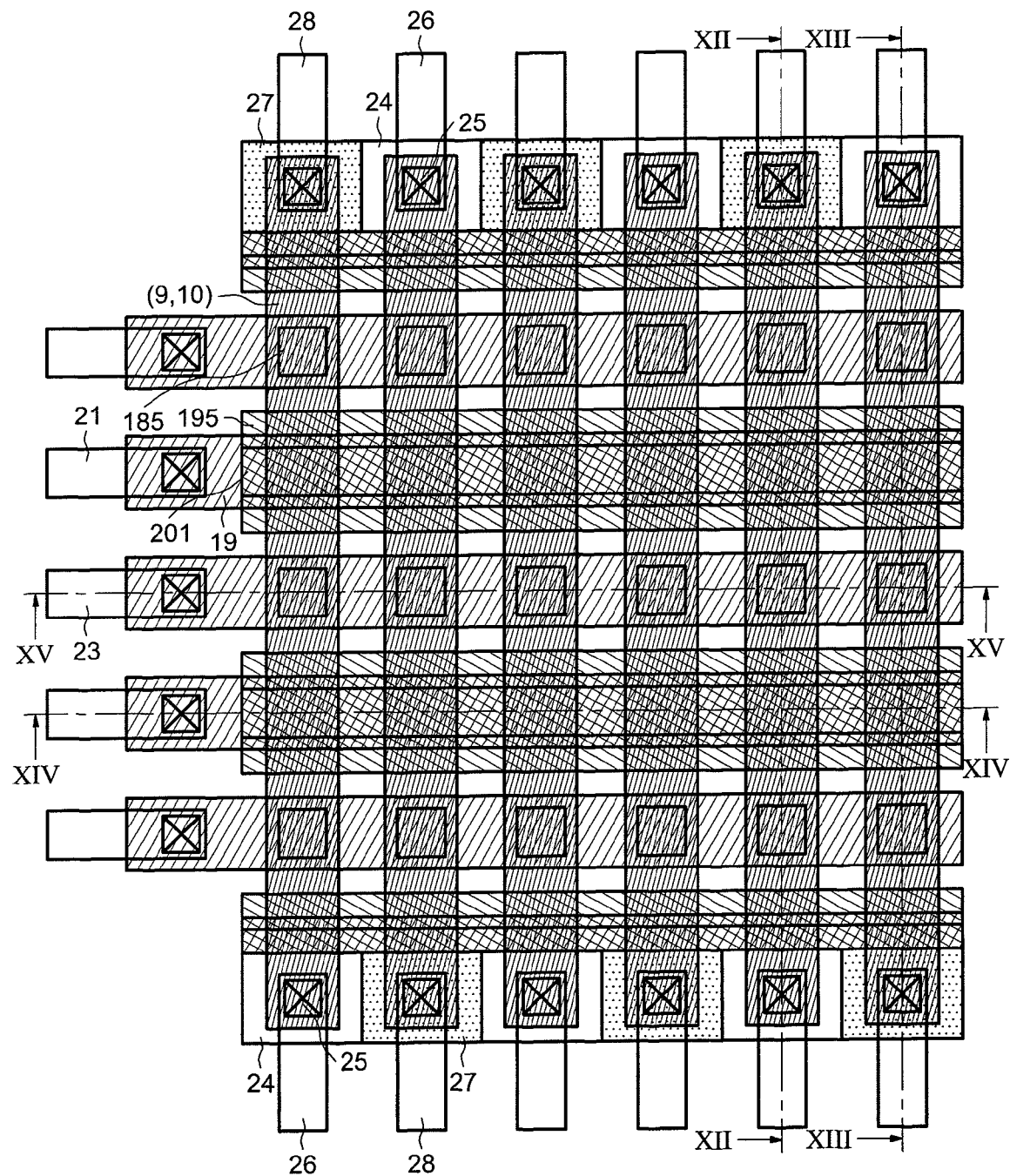
FIGS. 18 and 19 illustrate a matrix of integrated circuits according to one embodiment.

FIG. 18 shows a view of several integrated circuits arranged in a matrix. The elements described above are identified by the same references. Such a matrix allows the specific integrated circuit to be activated using the contact lines converging towards said integrated circuit.

Figure 19:
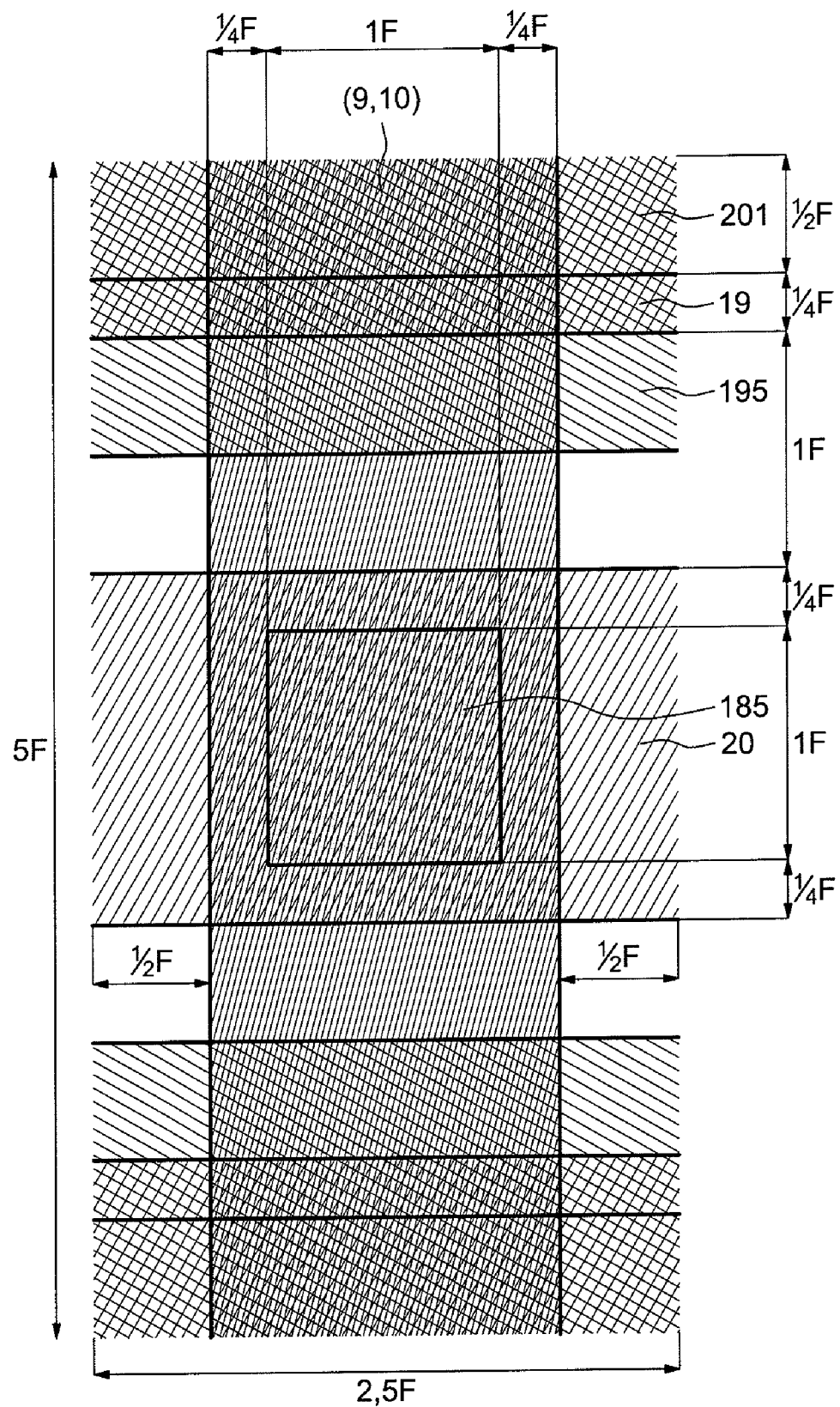

FIG. 19 shows a view similar to FIG. 18 centered on one of the gate-acting structures 185. The area covered by the various elements shown defines an integrated circuit, i.e. the smallest area for defining, by edge-to-edge repetition, a matrix of integrated circuits. Also included in FIG. 19 are scales indicating the size of the distances and dimensions between the elements of an integrated circuit. The arbitrary size unit is defined as equal to the side of a gate-acting structure 185. The distance between an electrode line 19 and a word line 20 is equal to one arbitrary unit. Likewise, the distance between two bit lines is equal to one arbitrary unit. The width of an isolating structure 201 is equal to one arbitrary unit. The width of an electrode line 19 is equal to one-and-a-half arbitrary units. The width of a word line 20 is equal to one-and-a-half arbitrary units. Thanks to these dimensional differences, the footprint of an elementary zone is estimated to be two-and-a-half arbitrary units in width by five arbitrary units in length. In the current state of the art, and merely as an example, the arbitrary unit may be estimated to be one half of the repetition length of the first level of metallization. The term "repetition length" is understood to mean the sum of the minimum distance between two features and the minimum width of a feature. This thus shows the high integration density obtained using the fabrication process.

The integrated circuit makes it possible to minimize the area occupied by a DRAM memory. The integrated circuit comprises, away from the substrate 1, a transistor whose source or drain region is common with an electrode of an associated capacitor. The dimensions of such an integrated circuit may be reduced by combining a source and drain region of the transistor with an electrode of the capacitor. Moreover, by combining a source and drain region of the transistor with the bit line, the interconnect requirements are limited, thereby further reducing the dimensions of an integrated circuit. Finally, the gate length of the transistor can be modified for varying the thickness of the intermediate zone 10 and/or the etching angle of a structure 185, while still limiting the impact that such a modification would have on the area occupied by the integrated circuit. Finally, the big lines are buried so as to protect them from the siliciding operation.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An integrated circuit memory cell, comprising:
   a substrate;
   at least one transistor produced in an active region comprising, separate from the substrate, a first layer containing a source or drain first region, a second layer above the first layer, and a third layer above the second layer containing a drain or source second region, respectively, which regions are connected by a channel formed in the second layer, and a gate structure adjacent said channel, said gate structure formed in a trench extending into at least the first and second layers;
   at least one memory cell capacitor positioned laterally adjacent the at least one transistor, comprising a first electrode, a second electrode and a dielectric layer between the first and second electrodes;
   at least one electrode line connected to the first electrode of the laterally adjacent memory cell capacitor; and
   at least one bit line located beneath the gate structure; and
   wherein the second electrode of said capacitor is formed at least partly in the third layer which also contains the drain or source second region of the transistor.

2. The integrated circuit memory cell according to claim 1, wherein the substrate comprises a silicon-on-insulator-based layer.

3. The integrated circuit memory cell according to claim 1, wherein the active region comprises a lower zone formed by the first layer, an intermediate zone formed by the second layer and an upper zone formed by the third layer, further including a first connection configured to bias the intermediate zone second layer.

4. The integrated circuit memory cell according to claim 1, wherein the at least one bit line is formed in the first layer which also contains the source or drain first region.

5. The integrated circuit memory cell according to claim 1, further including an isolating structure underneath the laterally adjacent memory cell capacitor that at least partly separates the second layer between two adjacent gate structures, wherein the third layer is immediately in contact with an upper surface of the second layer and wherein the third layer is completely separated into two by the laterally adjacent memory cell capacitor between two adjacent gate structures.

6. The integrated circuit memory cell according to claim 5, further including a second connection to configured to bias the first layer.

7. An integrated circuit memory cell, comprising:
   a substrate layer;
   an overlying semiconductor region divided into a lower layer zone of a first conductivity type doping, an intermediate layer zone of a second conductivity type doping and an upper layer zone of the first conductivity type doping;
   a gate structure formed in a cavity within the overlying semiconductor region having an insulating lining and a conductive filling;
   a first source or drain region formed in the lower layer zone adjacent the cavity of the gate structure;
   a second source or drain region formed in the upper layer zone adjacent the cavity of the gate structure;
   a memory cell capacitor having first and second electrodes and an insulator therebetween, wherein the memory cell capacitor is positioned laterally adjacent the second source or drain region, and wherein the second electrode is formed by the upper layer zone of the first conductivity type doping;
   an electrode line connected to the first electrode of the capacitor; and
   a bit line located beneath the gate structure and formed by the lower layer zone of the first conductivity type doping.

8. The integrated circuit memory cell of claim 7 further including a first connection configured to bias the intermediate layer zone.

9. The integrated circuit memory cell of claim 7 wherein the memory cell capacitor is formed in a second cavity laterally adjacent the first cavity which narrows in a width dimension towards the substrate, an insulating lining of the second cavity forming the capacitor insulator and a conductive filling of the second cavity forming the first electrode.

10. The integrated circuit memory cell of claim 7 further including a second connection configured to bias the lower layer zone.

11. The integrated circuit memory cell of claim 7 wherein the cavity narrows in a width dimension towards the substrate.

12. The integrated circuit memory cell according to claim 1, wherein the trench has a shape which converges towards the substrate.

13. An integrated circuit memory cell, comprising:
    an access transistor; and
    a memory cell capacitor connected to the access transistor;
    wherein the access transistor has a vertically oriented source, channel and drain configuration formed in a stack of three doped semiconductor layers including a top layer, a middle layer and a bottom layer; and
    wherein the memory cell capacitor is positioned laterally adjacent the access transistor and wherein a first plate electrode of the memory cell capacitor is formed by a portion of the top layer of the vertically oriented source, channel and drain configuration.

14. The integrated circuit memory cell of claim 13 wherein a second plate electrode of the memory cell capacitor is formed within a trench, said trench extending vertically into at least the top and middle layers of the vertically oriented source, channel and drain configuration.

15. The integrated circuit memory cell of claim 14 wherein the second plate electrode of the memory cell capacitor is formed by a metal material deposited within and filling said trench, the metal material isolated from the top and middle layers of the vertically oriented source, channel and drain configuration by an insulating film layer.

16. The integrated circuit memory cell of claim 15 wherein the access transistor includes a gate and wherein said insulating film layer extends and further forms a gate dielectric separating the gate from the three doped semiconductor layers.

17. The integrated circuit memory cell of claim 13 further including a bit line positioned underneath a gate of the access transistor, and wherein the bit line is formed by the bottom layer of the vertically oriented source, channel and drain configuration.

18. The integrated circuit memory cell of claim 17 wherein one of the source or drain of the access transistor is formed by a first doped region within the bottom layer of the vertically oriented source, channel and drain configuration.

19. The integrated circuit memory cell of claim 18 wherein the other of the source or drain of the access transistor is formed by a second doped region within the top layer of the vertically oriented source, channel and drain configuration.

20. The integrated circuit memory cell of claim 19 wherein the channel of the access transistor is formed by a portion of the middle layer of the vertically oriented source, channel and drain configuration.

21. The integrated circuit memory cell of claim 13 wherein the access transistor includes a gate formed within a trench, said trench extending vertically through the top and middle layers of the vertically oriented source, channel and drain configuration and at least partially into the bottom layer of the vertically oriented source, channel and drain configuration.

22. The integrated circuit memory cell of claim 21 wherein the gate is formed by a metal material deposited within and filling said trench, the metal material isolated from the three doped semiconductor layers by an insulating film layer.

23. The integrated circuit memory cell of claim 22 wherein said insulating film layer extends and further forms a capacitor dielectric layer separating the first plate electrode of the memory cell capacitor from a second plate electrode of the memory cell capacitor.

* * * * *